US006483367B2

(12) United States Patent
Kohsiek

(10) Patent No.: US 6,483,367 B2

(45) Date of Patent: Nov. 19, 2002

(54) CIRCUIT ARRANGEMENT FOR GENERATING AND AMPLIFYING AN AMPLITUDE LIMITED DC SIGNAL

(75) Inventor: Cord-Heinrich Kohsiek, Ellerau (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/011,970

(22) Filed: Dec. 3, 2001

(65) Prior Publication Data

US 2002/0084839 A1 Jul. 4, 2002

(30) Foreign Application Priority Data

Dec. 6, 2000 (DE) ........................................ 100 60 483

(51) Int. Cl.[7] ............................ G06F 7/556; G06G 7/24

(52) U.S. Cl. ....................................... 327/352; 327/359

(58) Field of Search ................................ 327/560, 563, 327/349, 350, 351, 352, 355, 357–359, 361, 246–248; 330/9, 252; 455/210, 308, 309, 341

(56) References Cited

U.S. PATENT DOCUMENTS 4,972,512 A * 11/1990 Garskamp ................... 327/350

5,338,985 A * 8/1994 Fotowat-Ahmady et al. .......................... 327/350

5,404,589 A * 4/1995 Bijker et al. ............. 455/200.1

5,570,055 A * 10/1996 Gilbert ....................... 327/350

* cited by examiner

*Primary Examiner*—My-Trang Nuton

(74) *Attorney, Agent, or Firm*—Aaron Waxler

(57) ABSTRACT

To provide a circuit arrangement (100) and a method for generating and amplifying an amplitude-limited DC signal whose level voltage is substantially proportional to the logarithm of the voltage amplitude of an input signal, by which the level indication, i.e. the level voltage of the DC signal generated and amplified in the circuit arrangement and by the method only depends on the amplitude and not on the frequency of the input signal, it is proposed that the last amplifier stage (30), particularly the collector circuits of the last amplifier stage (30) of an amplifier circuit comprising at least two amplifier stages (10; 20; 30) precedes a frequency (FM) demodulator unit (40), the frequency (FM) demodulator unit (40) precedes at least one quadrature stage (50, 60, 70) for squaring the output signal of the frequency (FM) demodulator unit (40), particularly the AC component of the output signal of the frequency (FM) demodulator unit (40), and at least one current adder unit (80) is provided for adding the level voltage of the output signal of the quadrature stage (50, 60, 70) to the level voltage of the amplifier stages (10; 20; 30).

19 Claims, 7 Drawing Sheets

CIRCUIT ARRANGEMENT FOR GENERATING AND AMPLIFYING AN AMPLITUDE LIMITED DC SIGNAL

BACKGROUND OF THE INVENTION

1. Field of the Invention

The invention relates to a circuit arrangement and a method for generating and amplifying an amplitude-limited DC signal whose level voltage is substantially proportional to the logarithm of the voltage amplitude of an input signal. Generally, the invention relates to the field of analog integrated circuits.

2. Description of the Related Art

Such circuit arrangements as well as such methods fulfill two functions. On the one hand, they are used for amplifying an AC signal which is applied to the circuit arrangement via its input terminals and, on the other hand, the amplitude of the output signal is limited by such a circuit arrangement and such a method. Consequently, the word "limiter amplifier" is generally used for such a circuit arrangement. Such limiter amplifiers are used, for example, in the frequency-modulated IF amplification in radio receivers or for gaining carriers from amplitude-modulated signals.

When such a limiter amplifier is given a simple extension, for example, in the form of a rectifier stage, a DC voltage can be generated which is widely proportional to the logarithm of the amplitude of the voltage of the input signal. When the amplitude of the output signal is plotted against the logarithm of the amplitude of the input voltage, a wide range of the input voltage shows a straight characteristic with a substantially constant rise. This straight characteristic is commonly referred to as "level characteristic".

Regarding such circuit arrangements and such methods for generating and amplifying an amplitude-limited DC signal, it is to be taken into account that the level voltage of the DC signal in the case of a frequency-modulated input signal (referred to as "FM-modulated input signal") is distorted when the input signal has previously passed through a circuit having a frequency-dependent amplitude variation, for example, in the form of an IF filter. In such a circuit, the frequency modulation (FM) is converted into an amplitude modulation (AM) which then undoubtedly becomes manifest as an unwanted level fluctuation in the level voltage of the DC signal, although the input signal was basically only frequency modulated (FM).

SUMMARY OF THE INVENTION

Based on the previously mentioned drawbacks and shortcomings, it is an object of the present invention to provide a circuit arrangement and a method of the type described in the opening paragraph, by which the level indication, i.e. the level voltage of the DC signal generated and amplified in the circuit arrangement and by the method only depends on the amplitude and not on the frequency of the input signal.

This object is solved by a circuit arrangement as defined in claim 1 and by a method as defined in claim 18. Advantageous embodiments and essential further improvements of the present invention are defined in the dependent claims.

In accordance with the teaching of the present invention, the level signal is corrected by means of a correction signal gained from the frequency (FM) demodulator unit, which correction signal compensates the influence of the frequency-dependent amplitude variation on the level signal. In other words, the amplitude-limited DC signal generated and amplified in accordance with the invention and having a level voltage which is substantially proportional to the logarithm of the voltage amplitude of an input signal only comprises information about the amplitude and not about the frequency.

It will be appreciated by those skilled in the art that the present invention provides a correcting compensation of the influence of the frequency modulation on the (logarithmic) level voltage. Such a compensation is required because frequency-modulated signals have amplitude fluctuations which were absent before they passed through a filter stage, because the filter stage has a frequency-dependent passband attenuation. By virtue of the present invention, it is surprisingly possible for those skilled in the art to acquire considerably more accurate indications of the level voltage about the signal level so that the circuit arrangement can be used in completely new fields of application.

The fundamental aspect of the present invention is that the level information of the input signal is initially indicated and/or detected by means of the at least one amplifier circuit comprising the at least two amplifier stages. After the output signal of the last amplifier stage, particularly the collector circuits of the last amplifier stage, has been frequency-demodulated by means of the at least one frequency (FM) demodulator unit, the output signal of the frequency (FM) demodulator unit, particularly the AC component of the output signal of the frequency (FM) demodulator unit, is corrected in the at least one quadrature stage. Finally, the level voltage of the output signal of the quadrature stage is added to the level voltage of the amplifier stages in at least one current adder unit.

In accordance with a preferred embodiment of the present invention, the quadrature stage is constituted by at least one, particularly non-negatively fed-back differential amplifier stage, at least one intermediate stage assigned to the differential amplifier stage, and at least one subsequent multiplier stage for multiplying the output signal of the intermediate stage. This multiplication product is added in the at least one current adder unit to the parts of the level characteristics of the amplifier stages.

In this connection, the level voltage of the output signal of the quadrature stage can be adapted to different circuits having a frequency-dependent amplitude variation and preceding the amplifier circuit, for example, to IF filters each having differently curved filter response curves, by varying the amplification of the quadrature stage.

The differential amplifier stage is suitably connected to the output of the frequency demodulator stage. In this connection, the differential amplifier is principally a linearly amplifying DC amplifier whose output voltage is proportional to the difference between the two input voltages. The basic circuit comprises two transistors jointly connected to the emitter and fed from a common constant current source. The differential amplifier is usually symmetrical because temperature influences and non-linearities then substantially compensate each other, which results in a small offset behavior.

In connection with the present invention, it is to be taken into account that it is known from the state of the art that the error in a frequency (FM) demodulator unit, caused by the group delay time of a filter preceding the frequency (FM) demodulator unit, can be compensated (cf. JP 61-187402). The prior art also discloses several types of frequency (FM) demodulator units (cf. DE-OS 17 66 837, JP-A-04-207209, JP-A-11-055038, JP-A-57-015505, or JP-A-60-070804), as well as filtering of the output signal of a limiter amplifier preceding a frequency (FM) demodulator unit for the purpose of avoiding distortions (cf. JP-A-55-083347).

However, none of the above-mentioned documents known from the state of the art deals with the detection of not only the amplitude but—due to the frequency-dependent transfer characteristic—also the frequency of the input signal. In other words, the prior art documents do not provide any stimulus concerning the reduction of the unwanted influence of the frequency-dependent amplitude variation.

The invention also relates to an integrated circuit, particularly an analog integrated circuit comprising at least one circuit arrangement of the type described hereinbefore and/or operating in accordance with a method as described hereinbefore.

These and other aspects of the invention are apparent from and will be elucidated with reference to the embodiments described hereinafter.

BRIEF DESCRIPTION OF THE DRAWINGS

FIG. 3) is plotted against time Z;

FIG. 5) is plotted against time.

DESCRIPTION OF THE PREFERRED EMBODIMENT

Figure 1:
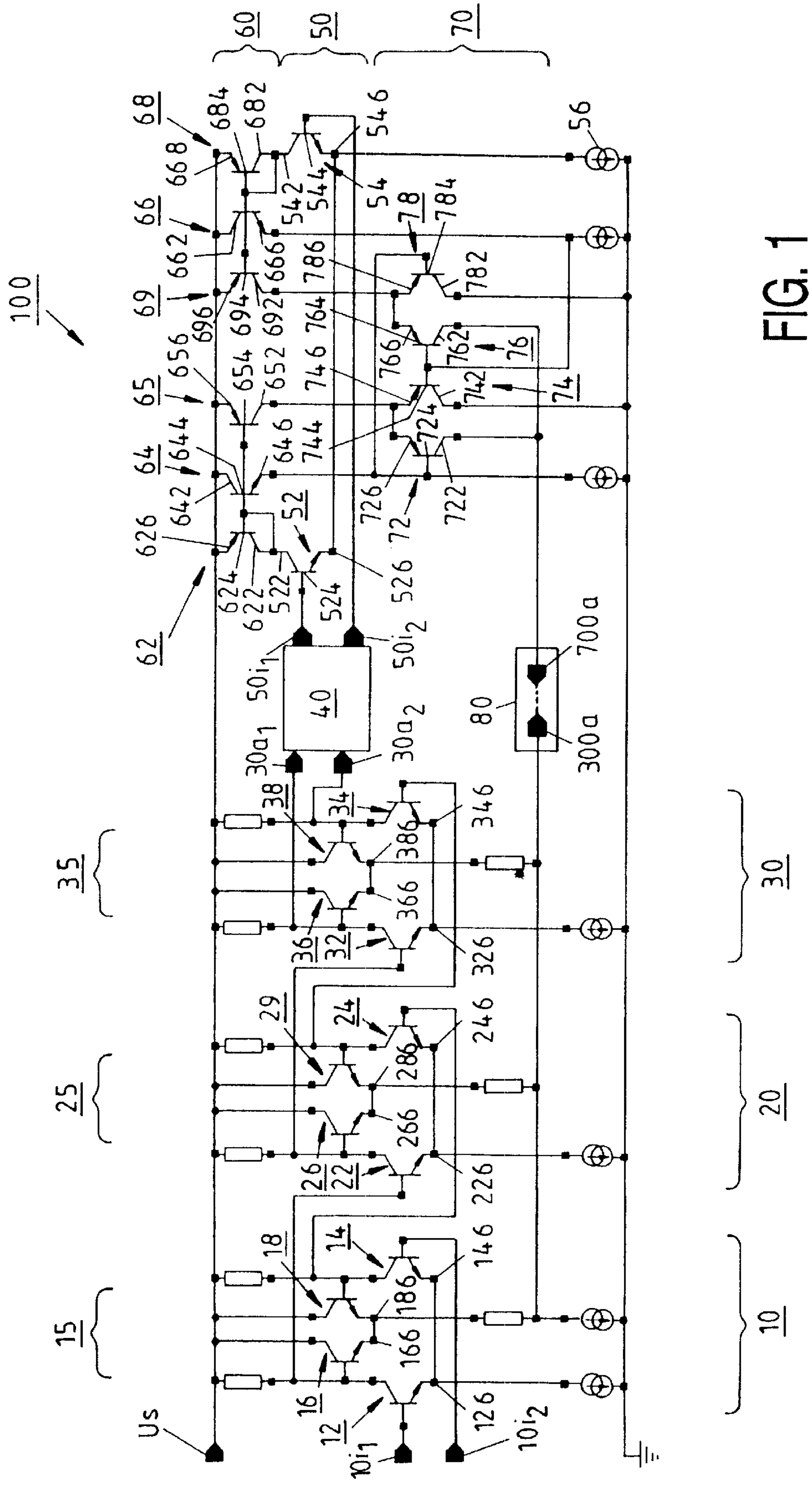
FIG. 1 shows diagrammatically an embodiment of a circuit arrangement according to the present invention.
Figure 2:
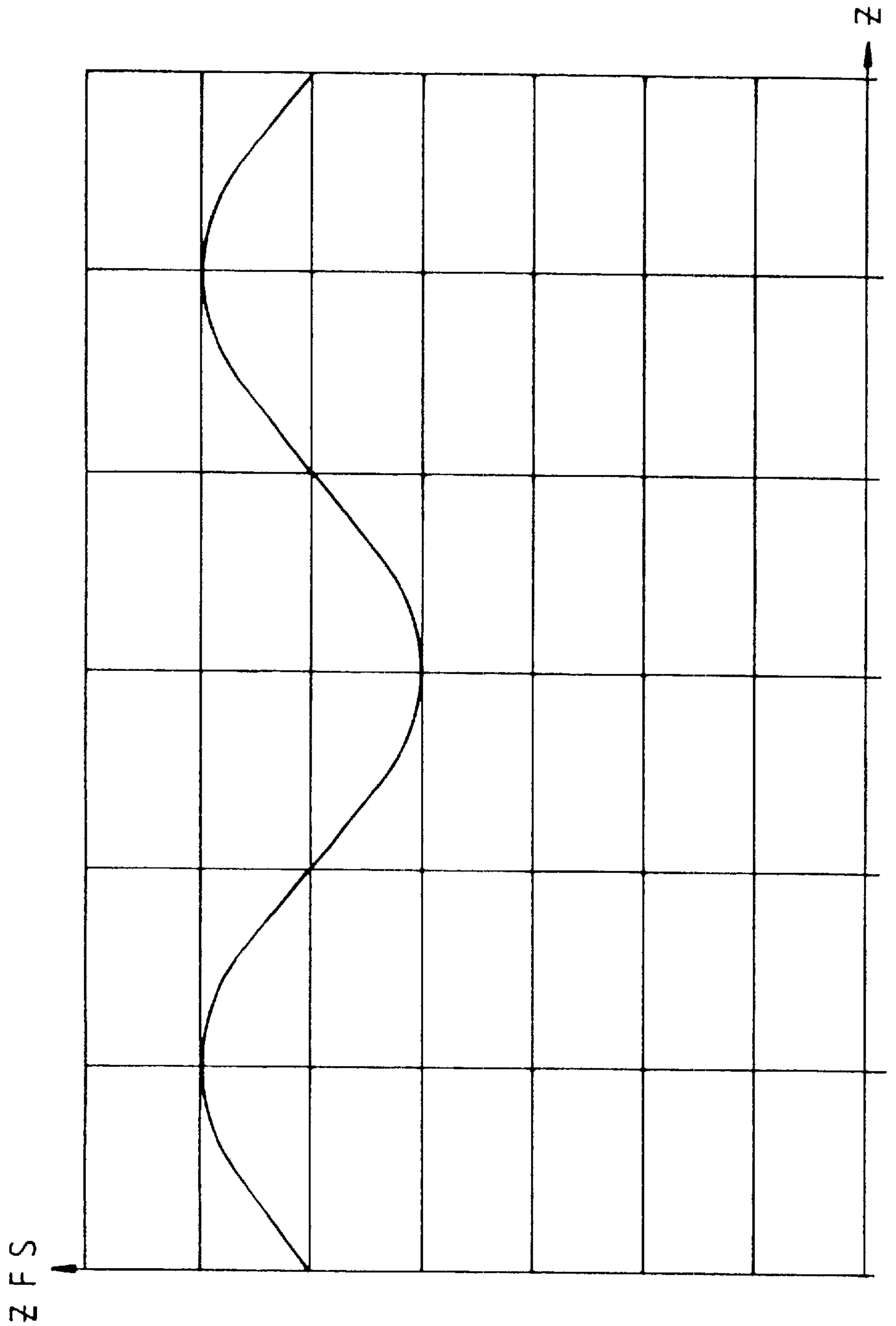
FIG. 2 is a diagram in which the instantaneous frequency of an IF signal is plotted against time Z.
Figure 3:
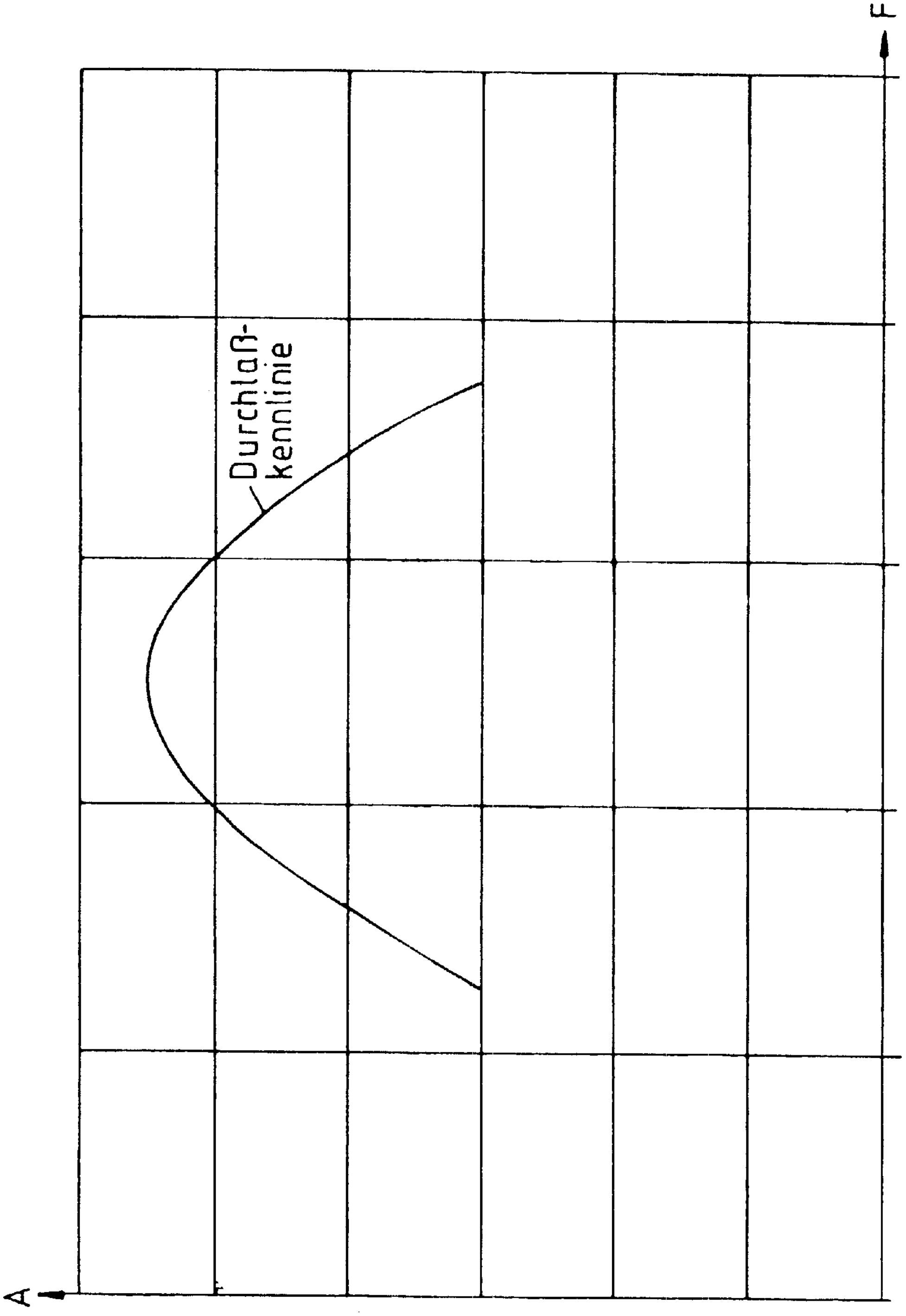
FIG. 3 is a diagram in which the amplitude-curved response characteristic of an integrated filter is plotted against the frequency F.

In the integrated circuit of a frequency-modulated (FM) radio receiver, the IF signal (frequency of the IF signal ZFS) (cf. FIG. 2) is passed through an integrated filter having a curved response characteristic (cf. FIG. 3) before it is applied via the two input terminals 10*i*1 and 10*i*2 to the circuit arrangement 100 shown by way of example with reference to FIG. 1, which circuit arrangement gains the level information from this signal and generates and amplifies a DC signal limited in its amplitude A, while its level voltage measured at a current adder unit 80 (cf. FIG. 1) is substantially proportional to the logarithm of the voltage amplitude of the signal.

To this end, the circuit arrangement 100 comprises an amplifier circuit having three amplifier stages 10, 20 and 30. Each amplifier stage 10, 20, 30 in turn comprises two npn transistors 12, 14; 22, 24 and 32, 34 whose respective emitters 126, 146; 226, 246 and 326, 346 are interconnected.

To generate a DC voltage which is widely proportional to the logarithm of the amplitude of the voltage of the input signals supplied via the first input terminal 10*i*1 of the first amplifier stage 10 and via the second input terminal 10*i*2 of the first amplifier stage 10, each amplifier stage 10, 20, 30 comprises at least one rectifier stage 15, 25, 35. Each rectifier stage 15, 25, 35 in turn comprises two npn transistors 16, 18; 26, 28 and 36, 38 whose respective emitters 166, 186; 266, 286 and 366, 386 are interconnected.

Figure 4:
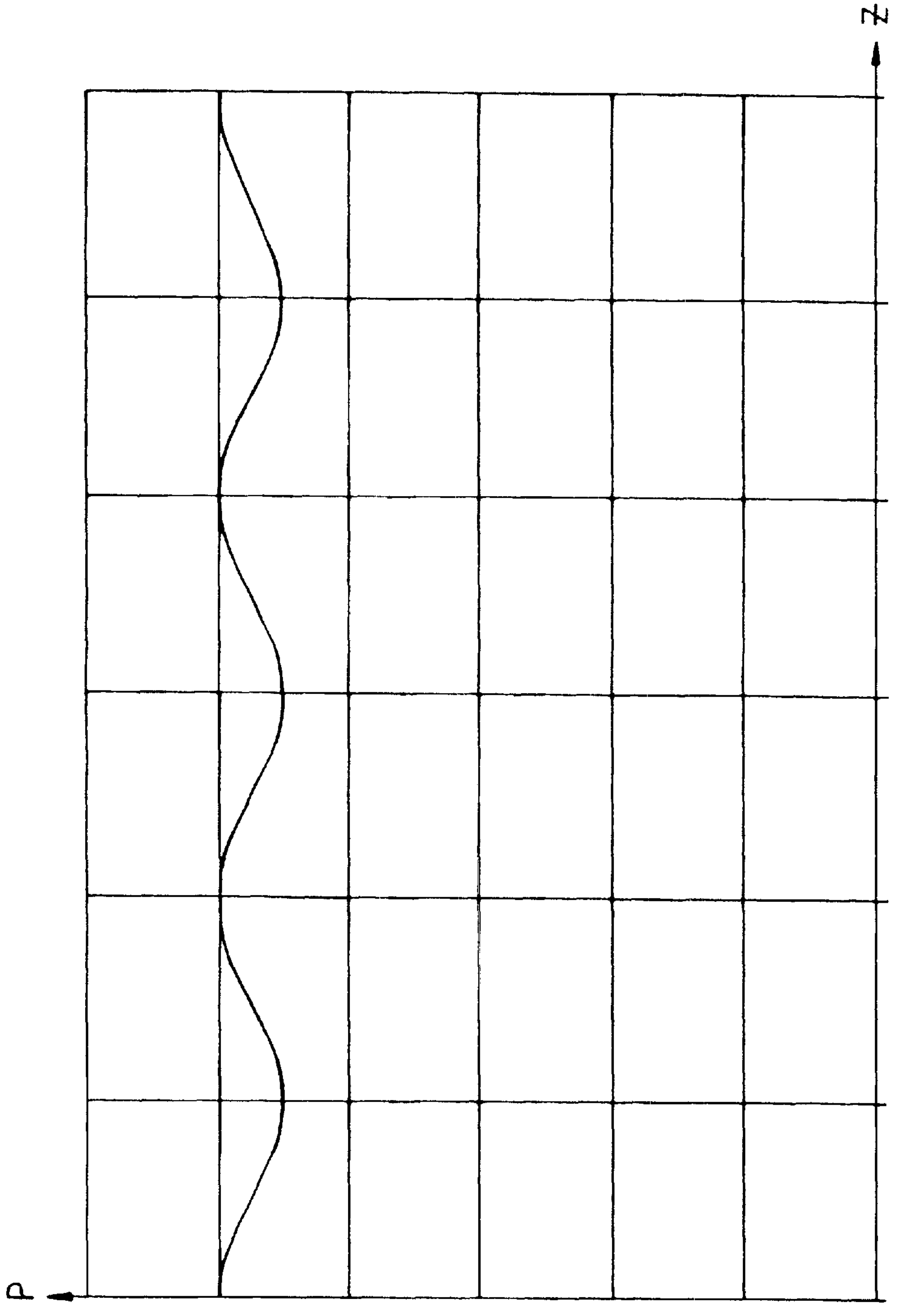
FIG. 4 is a diagram in which the level voltage or "level information" superimposed by the level fluctuation produced in the integrated filter (cf.
Figure 6:
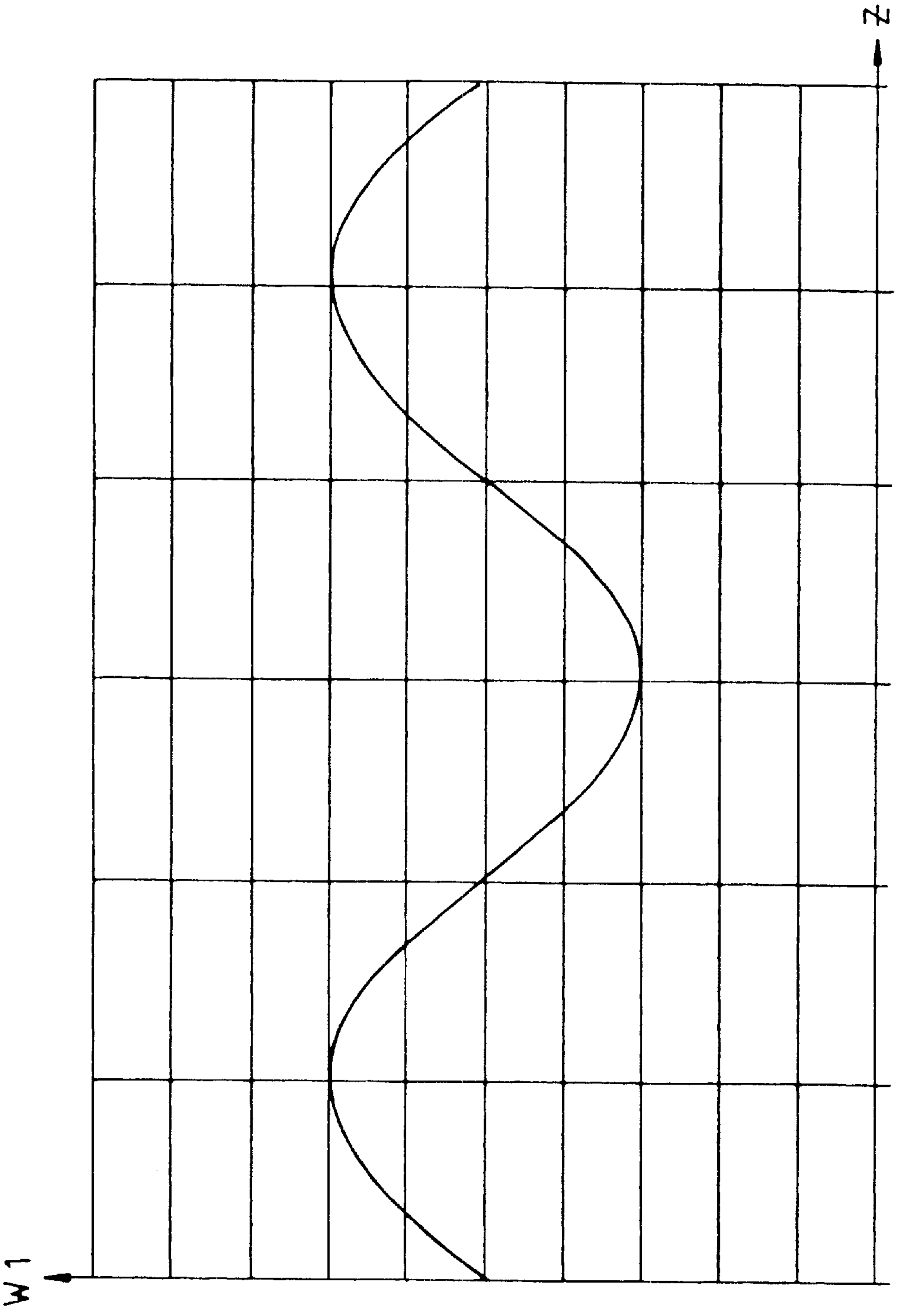
FIG. 6 is a diagram in which the AC component, squared in the correction circuit, of the output signal of the frequency (FM) demodulator unit (cf.
Figure 7:
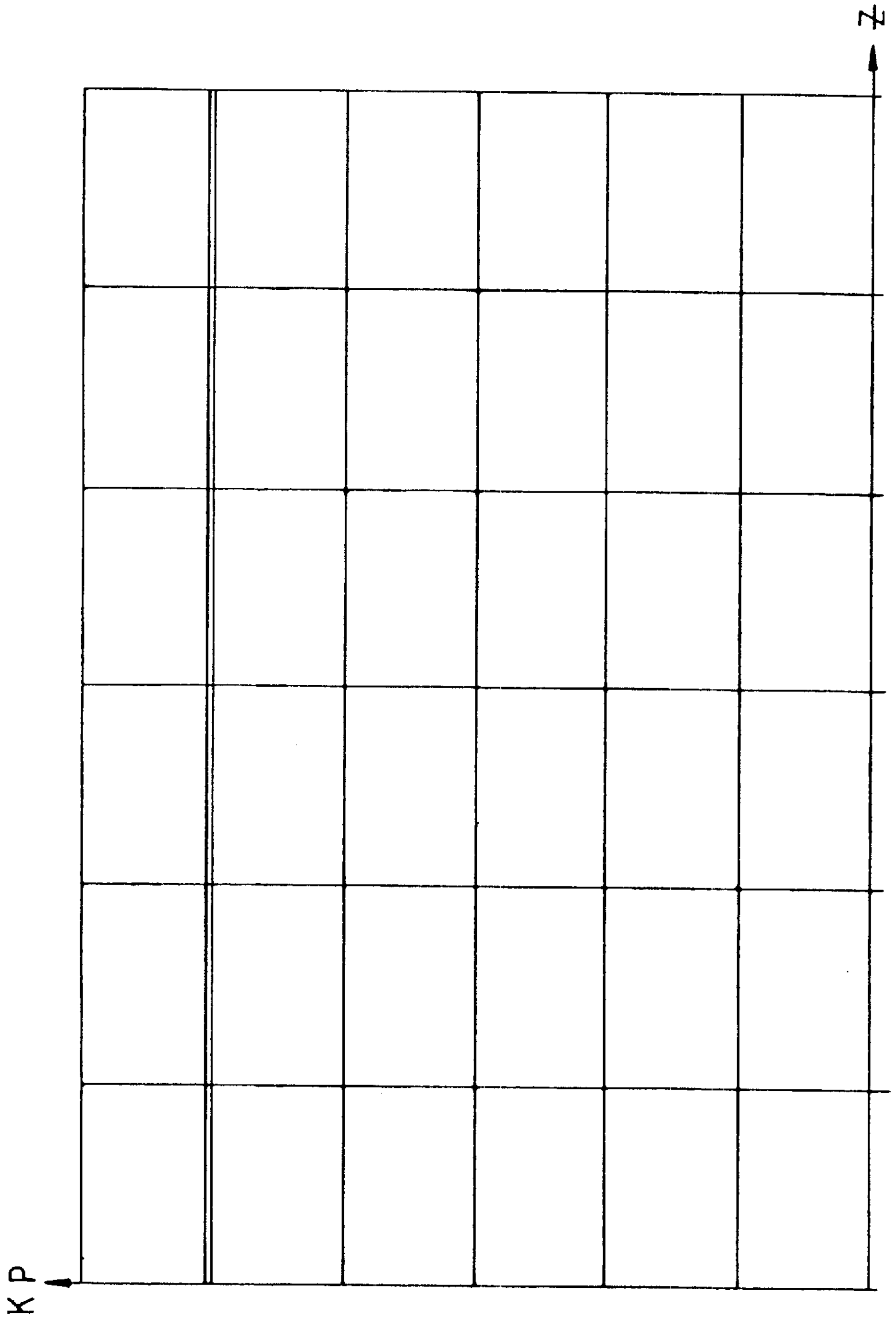
FIG. 7 is a diagram in which the corrected level voltage, i.e. the correction signal of the quadrature stage, added to the level signal of the amplifier circuit, is plotted against time.

Since the level information gained in the amplifier circuit is superimposed by the level fluctuation (level voltage with superimposed level fluctuation P) (cf. FIG. 4), produced in the integrated filter (cf FIG. 3), this error is compensated by squaring the AC component of the output signal (AC component of the output signal of the frequency (FM) demodulator unit W1) (cf. FIG. 5) of the frequency (FM) demodulator unit 40 in the quadrature stage 50, 60, 70 functioning as a correction circuit (squared AC component of the output signal of the frequency (FM) demodulator unit W2) (cf. FIG. 6) and by adding it as a correction signal to the level signal of the amplifier circuit (corrected control voltage KP) (cf. FIG. 7).

To this end, a non-negatively fed-back differential amplifier stage 50 is arranged parallel to the output of the frequency demodulator 40, whose input is connected to the output of the last amplifier stage 30. Particularly, output terminals 30o1 and 30o2 of the last amplifier stage 30 are connected via the frequency (FM) demodulator unit 40 to the bases 524 and 544 of two npn transistors 52 and 54, respectively. This differential amplifier stage 50 is connected to a current source 56, while the emitters 526 and 546 of the two npn transistors 52 and 54 are interconnected and are connected to the current source 56.

As is apparent from FIG. 1, an intermediate stage 60 is assigned to the differential amplifier stage 50, in that the collectors 522 and 542 of the npn transistors 52 and 54 are connected to the intermediate stage 60. The intermediate stage 60 comprises four transistors 62, 64 and 66, 68, namely two pnp transistors 62, 68 and two npn transistors 64, 66 which are at least partially connected to a power supply voltage Us. Furthermore, two pnp transistors 65, 69 are assigned to the intermediate stage 60.

Figure 5:
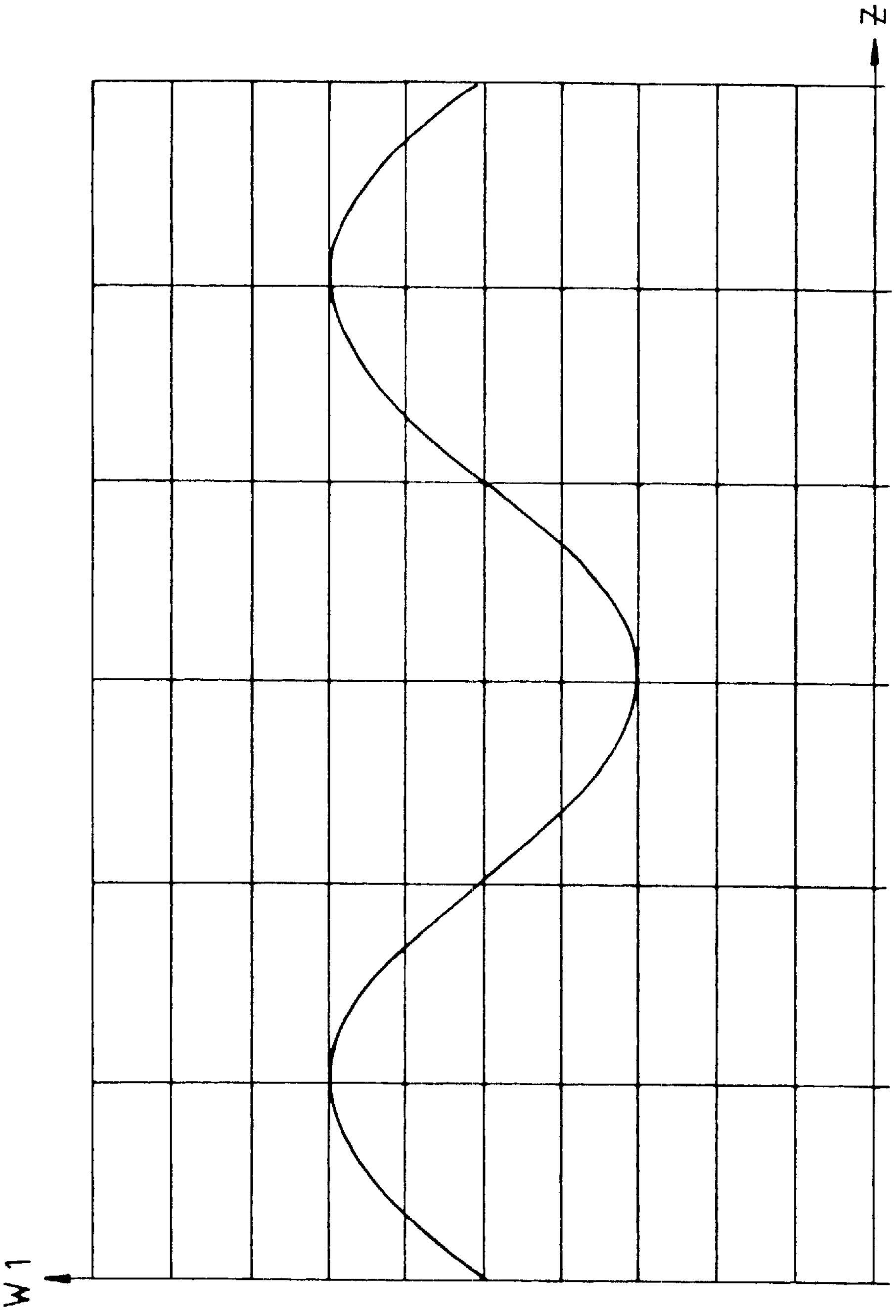
FIG. 5 is a diagram in which the AC component of the output signal of the frequency (FM) demodulator unit is plotted against time.

The differential amplifier stage 50 and the intermediate stage 60 precede a multiplier stage 70 for multiplying the output signals of the intermediate stage 60 (cf. Transition from FIG. 5 to FIG. 6). This multiplied output signal—or more accurately its level voltage—is then added in the current adder unit 80 to the respective level voltage of the amplifier stages 10, 20, 30.

Particularly, this multiplier stage 70 comprises four pnp transistors 72, 74 and 76, 78. The collector 742 of the second pnp transistor 74 and the collector 782 of the fourth pnp transistor 78 are connected to a reference potential, namely the earth potential, whereas the collector 722 of the first pnp transistor 72 and the collector 762 of the third pnp transistor 76 are connected to the output terminal 700o of the quadrature stage 50, 60, 70. Furthermore, the base 724 of the first pnp transistor 72 and the base 784 of the fourth pnp transistor 78 are connected to the emitter 646 of the second transistor 64 of the intermediate stage 60, while the base 744 of the second pnp transistor 74 and the base 764 of the third pnp transistor 76, as well as the respective emitters 726, 746, 766 and 786 are interconnected.

The circuit arrangement 100 shown by way of example in FIG. 1 ensures that the level indication, i.e. the level voltage of the DC signal generated and amplified in the circuit arrangement 100 and by means of the method only depends on the amplitude and not on the frequency of the input signal.

LIST OF REFERENCE SIGNS

| | |
|---|---|
| 100 | circuit arrangement |
| 10 | first amplifier stage |
| 10i1 | first input terminal of the first amplifier stage 10 |
| 10i2 | second input terminal of the first amplifier stage 10 |
| 12 | first transistor, particularly first npn transistor of the first amplifier stage 10 |
| 126 | emitter of the first transistor 12 of the first amplifier stage 10 |
| 14 | second transistor, particularly second npn transistor of the first amplifier stage 10 |
| 146 | emitter of the second transistor 14 of the first amplifier stage 10 |
| 15 | first rectifier stage |
| 16 | first transistor, particularly first npn transistor of the first rectifier stage 15 |
| 166 | emitter of the first transistor 16 of the first rectifier stage 15 |
| 18 | second transistor, particularly second npn transistor of the first rectifier stage 15 |
| 186 | emitter of the second transistor 18 of the first rectifier stage 15 |
| 20 | second amplifier stage |
| 22 | first transistor, particularly first npn transistor of the second amplifier stage 20 |
| 226 | emitter of the first transistor 22 of the second amplifier stage 20 |
| 24 | second transistor, particularly second npn transistor of the second amplifier stage 20 |
| 246 | emitter of the second transistor 24 of the second amplifier stage 20 |
| 25 | second rectifier stage |
| 26 | first transistor, particularly first npn transistor of the second rectifier stage 25 |
| 266 | emitter of the first transistor 26 of the second rectifier stage 25 |
| 28 | second transistor, particularly second npn transistor of the second rectifier stage 25 |
| 286 | emitter of the second transistor 28 of the second rectifier stage 25 |
| 30 | third amplifier stage = last amplifier stage |
| 30o1 | first output terminal of the last amplifier stage 30 |
| 30o2 | second output terminal of the last amplifier stage 30 |
| 300o | output terminal of the amplifier circuit |
| 32 | first transistor, particularly first npn transistor of the last amplifier stage 30 |
| 326 | emitter of the first transistor 32 of the last amplifier stage 30 |
| 34 | second transistor, particularly second npn transistor of the last amplifier stage 30 |
| 346 | emitter of the second transistor 34 of the last amplifier stage 30 |
| 35 | third rectifier stage = last rectifier stage |
| 36 | first transistor, particularly first npn transistor of the last rectifier stage 35 |
| 366 | emitter of the first transistor 36 of the last rectifier stage 35 |
| 38 | second transistor, particularly second npn transistor of the last rectifier stage 35 |
| 386 | emitter of the second transistor 38 of the last rectifier stage 35 |
| 40 | frequency (FM) demodulator unit |
| 50 | differential amplifier stage |
| 50i1 | first input terminal of the differential amplifier stage 50 |
| 50i2 | second input terminal of the differential amplifier stage 50 |
| 52 | first transistor, particularly first npn transistor of the differentiai amplifier stage 50 |
| 522 | collector of the first transistor 52 of the differential amplifier stage 50 |
| 524 | base of the first transistor 52 of the differential amplifier stage 50 |
| 526 | emitter of the first transistor 52 of the differential amplifier stage 50 |
| 54 | second transistor, particularly second npn transistor of the differential amplifier stage 50 |
| 542 | collector of the second transistor 54 of the differential amplifier stage 50 |
| 544 | base of the second transistor 54 of the differential amplifier stage 50 |
| 546 | emitter of the second transistor 54 of the differential amplifier stage 50 |
| 56 | current source |
| 60 | intermediate stage |
| 62 | first transistor, particularly first pnp transistor of the intermediate stage 60 |
| 622 | collector of the first transistor 62 of the intermediate stage 60 |
| 624 | base of the first transistor 62 of the intermediate stage 60 |
| 626 | emitter of the first transistor 62 of the intermediate stage 60 |
| 64 | second transistor, particularly first npn transistor of the intermediate stage 60 |
| 642 | collector of the second transistor 64 of the intermediate stage 60 |
| 644 | base of the second transistor 64 of the intermediate stage 60 |
| 646 | emitter of the second transistor 64 of the intermediate stage 60 |
| 65 | first transistor, particularly pnp transistor, assigned to the intermediate stage 60 |
| 652 | collector of the assigned, first transistor 65 |
| 654 | base of the assigned, first transistor 65 |
| 656 | emitter of the assigned, first transistor 65 |
| 66 | third transistor, particularly second npn transistor of the intermediate stage 60 |
| 662 | collector of the third transistor 66 of the intermediate stage 60 |
| 664 | base of the third transistor 66 of the intermediate stage 60 |
| 666 | emitter of the third transistor 66 of the intermediate stage 60 |
| 68 | fourth transistor, particularly second pnp transistor of the intermediate stage 60 |
| 682 | collector of the fourth transistor 68 of the intermediate stage 60 |

-continued

| | |
|---|---|
| 684 | base of the fourth transistor 68 of the intermediate stage 60 |
| 686 | emitter of the fourth transistor 68 of the intermediate stage 60 |
| 69 | second transistor, particularly pnp transistor, assigned to the intermediate stage 60 |
| 692 | collector of the assigned, second transistor 69 |
| 694 | base of the assigned, second transistor 69 |
| 696 | emitter of the assigned, second transistor 69 |
| 70 | multiplier stage |
| 700o | output terminal of the multiplier stage 70 |
| 72 | first transistor, particularly first pnp transistor of the multiplier stage 70 |
| 722 | collector of the first transistor 72 of the multiplier stage 70 |
| 724 | base of the first transistor 72 of the multiplier stage 70 |
| 726 | emitter of the first transistor 72 of the multiplier stage 70 |
| 74 | second transistor, particularly second pnp transistor of the multiplier stage 70 |
| 742 | collector of the second transistor 74 of the multiplier stage 70 |
| 744 | base of the second transistor 74 of the multiplier stage 70 |
| 746 | emitter of the second transistor 74 of the multiplier stage 70 |
| 76 | third transistor, particularly third pnp transistor of the multiplier stage 70 |
| 762 | collector of the third transistor 76 of the multiplier stage 70 |
| 764 | base of the third transistor 76 of the multiplier stage 70 |
| 766 | emitter of the third transistor 76 of the multiplier stage 70 |
| 78 | fourth transistor, particularly fourth pnp transistor of the multiplier stage 70 |
| 782 | collector of the fourth transistor 78 of the multiplier stage 70 |
| 784 | base of the fourth transistor 78 of the multiplier stage 70 |
| 786 | emitter of the fourth transistor 78 of the multiplier stage 70 |
| 80 | current adder unit |
| Us | power supply voltage |

What is claimed is:

1. A circuit arrangement (100) for generating and amplifying an amplitude-limited DC signal whose level voltage is substantially proportional to the logarithm of the voltage amplitude of an input signal, characterized in that the last amplifier stage (30), particularly the collector terminals of the last amplifier stage (30) of an amplifier circuit comprising at least two amplifier stages (10; 20; 30) precedes a frequency (FM) demodulator unit (40), the frequency (FM) demodulator unit (40) precedes at least one quadrature stage (50, 60, 70) for squaring the output signal of the frequency (FM) demodulator unit (40), particularly the AC component of the output signal of the frequency (FM) demodulator unit (40), and at least one current adder unit (80) is provided for adding the level voltage of the output signal of the quadrature stage (50, 60, 70) to the level voltage of the amplifier stages (10; 20; 30).

2. A circuit arrangement (100) as claimed in claim 1, characterized in that, while building the quadrature stage (50, 60, 70), at least one negatively fed-back or non-negatively fed-back differential amplifier stage (50) is connected to the output of a frequency demodulator (40), at least one intermediate stage (60) is assigned to the differential amplifier stage (50), and the differential amplifier stage (50) and the intermediate stage (60) precede at least one multiplier stage (70) for multiplying the output signal from the intermediate stage (60).

3. A circuit arrangement (100) as claimed in claim 2, characterized in that the intermediate stage (60) comprises at least one current mirror unit.

4. A circuit arrangement (100) as claimed in claim 2, characterized in that the differential amplifier stage (50) is connected to at least one current source (56).

5. A circuit arrangement (100) as claimed in claim 4, characterized in that the characteristic curve of the level voltage of the circuit arrangement (100) is extendable to smaller level voltages of the circuit arrangement (100) by increasing the value of the current supplied by the current source (56) and/or by inserting high-ohmic resistors.

6. A circuit arrangement (100) as claimed in claim 2, characterized in that the differential amplifier stage (50) comprises at least two transistors (52, 54), particularly npn transistors.

7. A circuit arrangement (100) as claimed in claim 6, characterized in that the emitters (526, 546) of the transistors (52, 54) are interconnected and are connected to the current source (56).

8. A circuit arrangement (100) as claimed in claim 6 characterized in that output terminals (3001, 3002) of the last amplifier stage (30) are connected to the respective bases (524, 544) of the transistors (52, 54) via the frequency (FM) demodulator unit (40).

9. A circuit arrangement (100) as claimed in claim 6, characterized in that the collectors (522, 542) of the transistors (52, 54) are connected to the intermediate stage (60).

10. A circuit arrangement (100) as claimed in claim 2, characterized in that the intermediate stage (60) comprises at least four transistors (62, 64 and 66, 68), particularly at least two pnp transistors (62, 68) and at least two npn transistors (64, 66) which are at least partially connected to a power supply voltage (Us).

11. A circuit arrangement (100) as claimed in claim 2, characterized in that at least two transistors (65, 69), particularly at least two pnp transistors, are assigned-to the intermediate stage (60).

12. A circuit arrangement (100) as claimed in claim 2, characterized in that the multiplier stage (70) comprises at least four transistors (72, 74) and (76, 78), particularly pnp transistors, whose respective collectors (742, 782) are connected to a reference potential and whose respective collectors (722, 762) are connected to the output terminal (700o) of the quadrature stage (50, 60, 70), whose respective bases (724, 784) are connected to the emitter (646) of the second transistor (64) of the intermediate stage (60) and whose respective bases (744, 764) are interconnected, and whose respective emitters (726, 746) and (766, 786) are interconnected.

13. A circuit arrangement (100) as claimed in claim 12, characterized in that the reference potential is the earth potential and/or the ground potential.

14. A circuit arrangement (100) as claimed in claim 1, characterized in that each amplifier stage (10; 20; 30) comprises at least two transistors (12, 14; 22, 24; 32, 34), particularly at least two npn transistors whose respective emitters (126, 146; 226, 246; 326, 346) are interconnected.

15. A circuit arrangement (100) as claimed in claim 1, characterized in that each amplifier stage (10; 20; 30) incorporates at least one rectifier stage (15; 25; 35).

16. A circuit arrangement (100) as claimed in claim 15, characterized in that each rectifier stage (15; 25; 35) comprises at least two transistors (16, 18; 26, 28; 36, 38), particularly at least two npn transistors whose respective emitters (166, 186; 266, 286; 366, 386) are interconnected.

17. An integrated circuit, particularly an analog integrated circuit, comprising at least one circuit arrangement (100) as claimed in claim 1.

18. A method of generating and amplifying an amplitude-limited DC signal whose level voltage is substantially proportional to the logarithm of the voltage amplitude of an input signal, characterized in that the method comprises the steps indicating and/or detecting the level information of the input signal by means of at least one amplifier circuit comprising at least one amplifier stage (10; 20; 30);

demodulating the output signal of the last amplifier stage (30), particularly the collector terminals of the last amplifier stage (30), by means of at least one frequency (FM) demodulator unit (40);

squaring the output signal of the frequency (FM) demodulator unit (40), particularly the AC component of the output signal of the frequency (FM) demodulator unit (40) by means of at least one quadrature stage (50, 60, 70); and adding the level voltage of the output signal of the quadrature stage (50, 60, 70) to the level voltage of the amplifier stages (10; 20; 30) by means of at least one current adder unit (80).

19. A method as claimed in claim 18, characterized in that the level voltage of the output signal of the quadrature stage (50, 60, 70) is adapted to different circuits having a frequency-dependent amplitude variation and preceding the amplifier circuit, for example, to IF filters each having differently curved filter response curves, by varying the amplification of the quadrature stage (50, 60, 70).

* * * * *